(12) United States Patent
Kennedy

(10) Patent No.: US 9,584,896 B1
(45) Date of Patent: Feb. 28, 2017

(54) AMBIENT NOISE HEADPHONES

(71) Applicant: Lethinal Kennedy, Bronx, NY (US)

(72) Inventor: Lethinal Kennedy, Bronx, NY (US)

( * ) Notice: Subject to any disclaimer, the term of this patent is extended or adjusted under 35 U.S.C. 154(b) by 0 days.

(21) Appl. No.: 15/019,350

(22) Filed: Feb. 9, 2016

(51) Int. Cl.
*H04R 1/10* (2006.01)
*H03F 3/183* (2006.01)

(52) U.S. Cl.
CPC ........... *H04R 1/1041* (2013.01); *H03F 3/183* (2013.01); *H03F 2200/03* (2013.01); *H04R 2420/01* (2013.01); *H04R 2430/01* (2013.01); *H04R 2460/05* (2013.01)

(58) Field of Classification Search
CPC ........ H04R 1/1083; H04R 3/04; H04R 5/033; H04R 1/1008; H04R 2430/01; H04R 1/1041; H04R 29/001; H04R 2420/07; H04R 2205/024; H04R 29/002; H04R 3/12; H04R 2201/107; H04R 2460/01; H04R 27/00
USPC ...... 381/71.6, 74, 103, 56, 106, 107, 75, 57, 381/58, 71.1, 309, 370, 59, 72, 73.1, 108, 381/315, 364, 371, 71.8, 104, 109, 110, 381/122, 123, 151, 23.1, 372, 373, 380, 381/384, 66, 71.11, 71.12, 71.14, 71.2, 381/71.5, 77, 80, 86, 98
See application file for complete search history.

(56) References Cited

U.S. PATENT DOCUMENTS

| 4,455,677 A | 6/1984 | Fox |
| D376,598 S | 12/1996 | Hayashi |
| 6,993,140 B1 | 1/2006 | Chen |
| 8,023,663 B2 | 9/2011 | Goldberg |
| 2010/0215198 A1 | 8/2010 | Ngia |
| 2011/0206217 A1 | 8/2011 | Weis |
| 2015/0036834 A1 | 2/2015 | Bauman |
| 2015/0280669 A1* | 10/2015 | Vilermo ............... H04R 1/1041 381/107 |

FOREIGN PATENT DOCUMENTS

WO   WO2006036262 A2   4/2006

* cited by examiner

*Primary Examiner* — Akelaw Teshale
(74) *Attorney, Agent, or Firm* — Kyle A. Fletcher, Esq.

(57) ABSTRACT

The ambient noise headphone is a pair of headphones or a pair of earbuds that have an integral external microphone. The external microphone picks up the ambient noise external to the user and mixes this ambient noise with the primary audio source being listened to by the user. The external microphone circuitry has a volume control that allows the user to set the volume level of the ambient noise that is heard. This arrangement allows the user to monitor his external environment by controlling the amount of noise that the user can hear when listening to the pair of headphones or to the pair of earbuds. The ambient noise headphone comprises a pair of headphones, an external microphone, and a mixing circuit.

10 Claims, 5 Drawing Sheets

AMBIENT NOISE HEADPHONES

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of acoustic transducers, more specifically, earphones configured for use with a microphone.

SUMMARY OF INVENTION

The ambient noise headphone is a pair of headphones or a pair of earbuds that have an integral external microphone. The external microphone picks up the ambient noise external to the user and mixes this ambient noise with the primary audio source being listened to by the user. The external microphone circuitry has a volume control that allows the user to set the volume level of the ambient noise that is heard. This arrangement allows the user to monitor his external environment by controlling the amount of noise that the user can hear when listening to the pair of headphones or to the pair of earbuds.

These together with additional objects, features and advantages of the ambient noise headphone will be readily apparent to those of ordinary skill in the art upon reading the following detailed description of the presently preferred, but nonetheless illustrative, embodiments when taken in conjunction with the accompanying drawings.

In this respect, before explaining the current embodiments of the ambient noise headphone in detail, it is to be understood that the ambient noise headphone is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the ambient noise headphone.

It is therefore important that the claims be regarded as including such equivalent construction insofar as they do not depart from the spirit and scope of the ambient noise headphone. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description serve to explain the principles of the invention. They are meant to be exemplary illustrations provided to enable persons skilled in the art to practice the disclosure and are not intended to limit the scope of the appended claims.

DETAILED DESCRIPTION OF THE EMBODIMENT

Figure 1:
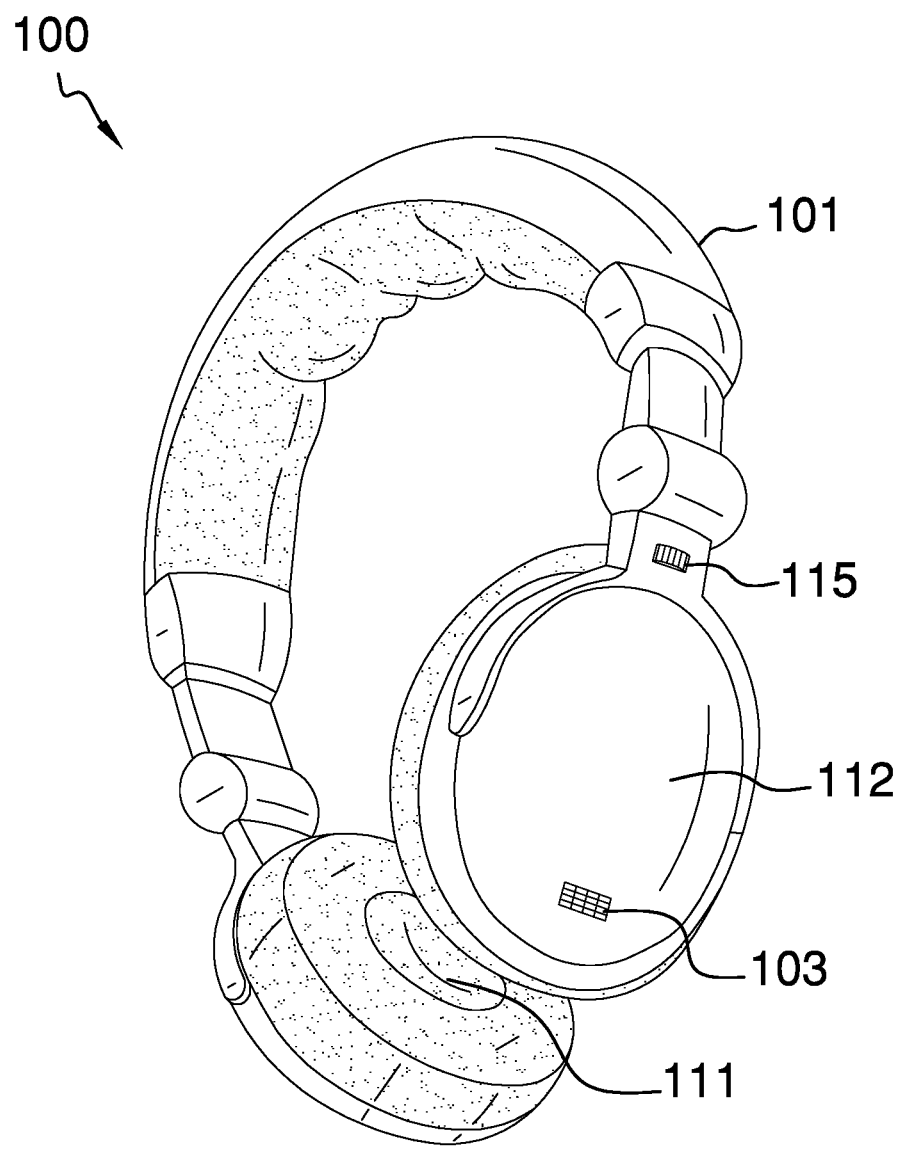
FIG. 1 is a perspective view of an embodiment of the disclosure.
Figure 2:
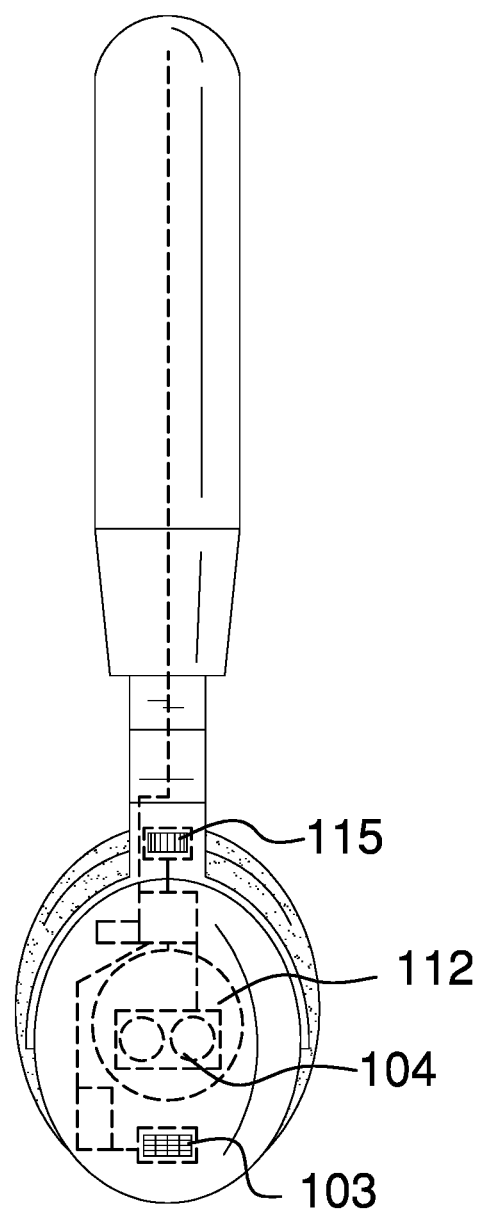
FIG. 2 is a side view of an embodiment of the disclosure.

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Detailed reference will now be made to a two potential embodiments of the disclosure, which is illustrated in FIGS. 1 through 5.

The ambient noise headphone 100 (hereinafter invention) comprises a headphones 101 or an earbud 102, an external microphone 103, and a mixing circuit 104. The invention 100 is a pair of headphones 101 or a pair of earbuds 102 that have an integral external microphone 103. The external microphone 103 picks up the ambient noise external to the user and mixes this ambient noise with the plurality of audio sources 154 being listened to by the user. The mixing circuit 104 has a volume control 115 that allows the user to set the volume level of the ambient noise that is heard. This arrangement allows the user to monitor his external environment by controlling the amount of ambient noise that the user can hear when listening to the plurality of audio sources 154 through the pair of headphones 101 or the pair of earbuds 102.

It is explicitly acknowledged that headphones 101 and earbuds 102 may only comprises a single speaker in some applications. However, the specification and claims of this disclosure will hereinafter implicitly assume that the term headphones 101 includes both a pair of headphone speakers and a single headphone speaker. Those skilled in the art will recognize that the disclosure can be readily modified to accommodate a single headphone with a minimum of modification and experimentation. Except where explicitly noted, the specification and claims of this disclosure will hereinafter also assume that the term headphones 101 includes earbuds 102 including a pair of earbud speakers or a single earbud speaker. Those skilled in the art will recognize that the disclosure can be readily modified to accommodate earbuds 102 with a minimum of modification and experimentation. These assumptions are made for the purposes of simplicity and for clarity of exposition of the disclosure is not intended to limit the scope of the specification or the appended claims.

The headphones 101 is a readily and commercially available headset that is modified to receive ambient noise through the external microphone 103 and to mix the ambient noise into the plurality of audio sources 154 so that both the ambient noise and the plurality of audio sources 154 can be simultaneously heard. The headphones 101 comprises a first speaker 111, a second speaker 112, a first cable 113, and a first jack 114. The plurality of audio sources 154 further comprises a first channel audio source 151 and a second channel audio source 152. It can happen that the first channel audio source 151 and the second channel audio source 152 are identical. The external microphone 103 is a readily and commercially available microphone. Optionally, the external microphone 103 is one of a pair of external microphones that are each provided adjacent to the first speaker 111 and the second speaker 112, respectively. Moreover, the use of a pair of the external microphones 103 is specific to introducing ambient noise to the respective speaker.

The purpose of the mixing circuit 104 is: 1) to receive the audio signal from the external microphone 103; 2) to amplify the audio signal to the appropriate volume to form an ambient noise audio source 153; 3) to mix the ambient noise audio source 153 with the first channel audio source 151 and to provide the mixed audio source to the first speaker 111; and, 4) to mix the ambient noise audio source 153 to the second channel audio source 152 and to provide the mixed audio source to the second speaker 112. The mixing circuit 104 further comprises an input circuit 121, a first channel 122, and a second channel 123. The input circuit 121 receives the audio signal and creates the ambient noise audio source 153. The first channel 122 mixes the ambient noise audio source 153 with the first channel audio source 151 and provides the mixed audio source to the first speaker 111. The second channel 123 mixes the ambient noise audio source 153 with the second channel audio source 152 and provides the mixed audio source to the second speaker 112.

The input circuit 121 further comprises a first resistor 131, a second resistor 132, a third resistor 133, a fourth resistor 134, a first amplifier 145, and a second amplifier 146. The first resistor 131 is further defined with a first lead 161 and a second lead 162. The second resistor 132 is further defined with a third lead 163 and a fourth lead 164. The third resistor 133 is further defined with a fifth lead 165 and a sixth lead 166. The fourth resistor 134 is further defined with a seventh lead 167 and an eighth lead 168. The second resistor 132 is a variable resistor such as a potentiometer. The third resistor 133 and the fourth resistor 134 have the same resistance. The first amplifier 145 and the second amplifier 146 are shown as readily and commercially available operational amplifiers, however, those skilled in the art can, at their discretion, readily substitute other amplification methods.

Figure 3:
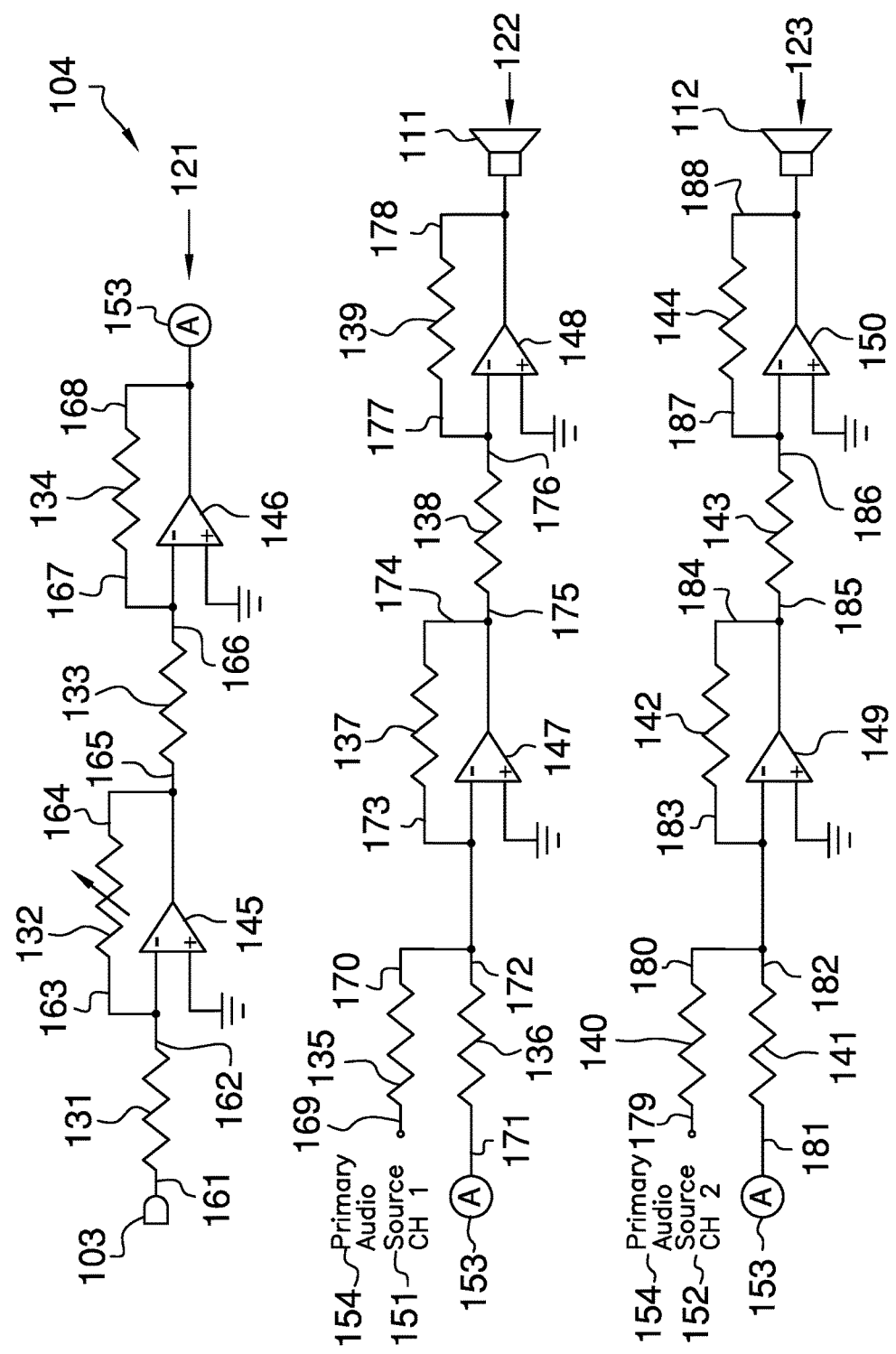
FIG. 3 is a schematic view of an embodiment of the disclosure.
Figure 4:
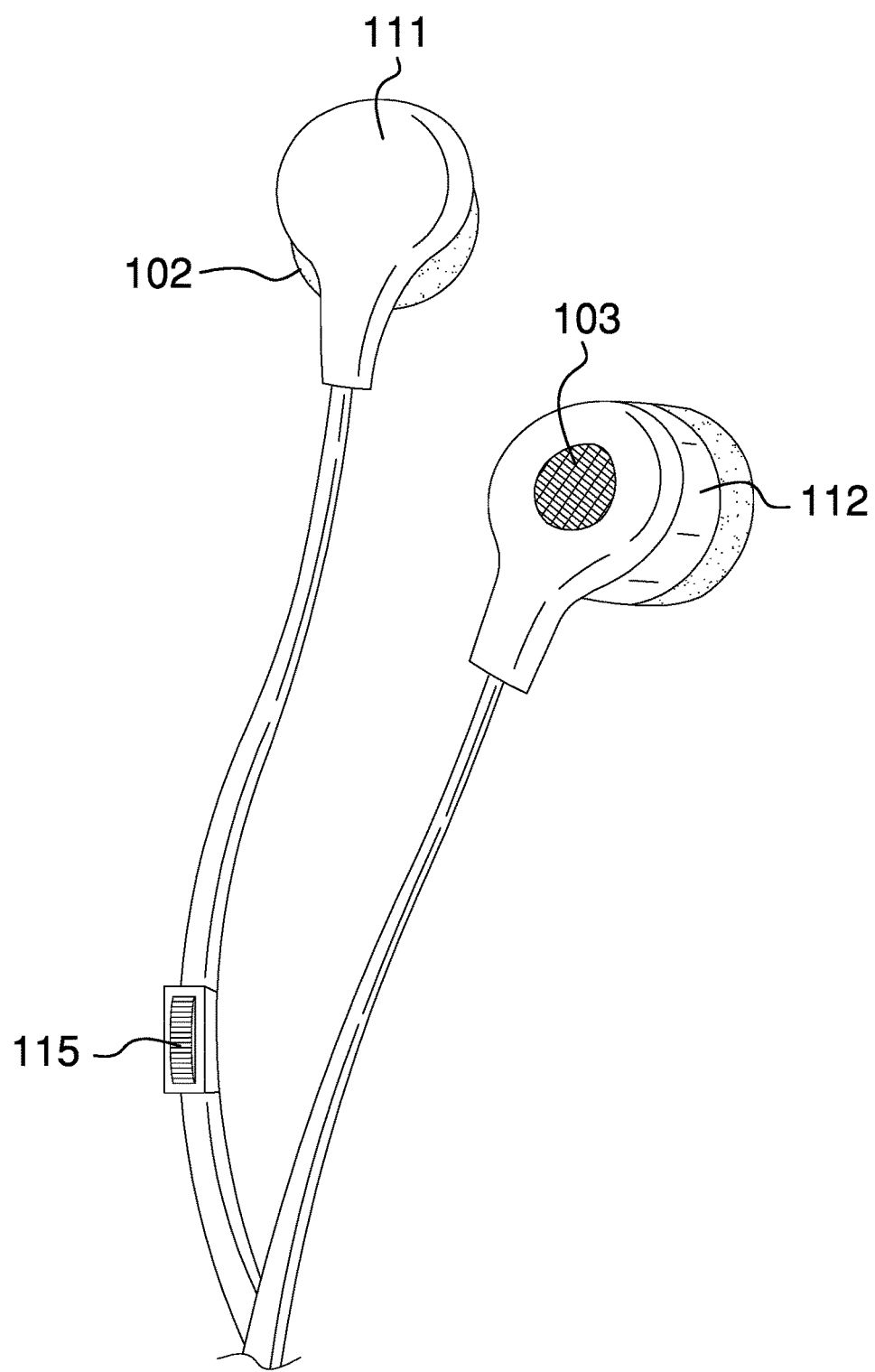
FIG. 4 is a perspective view of an alternative embodiment of the disclosure.
Figure 5:
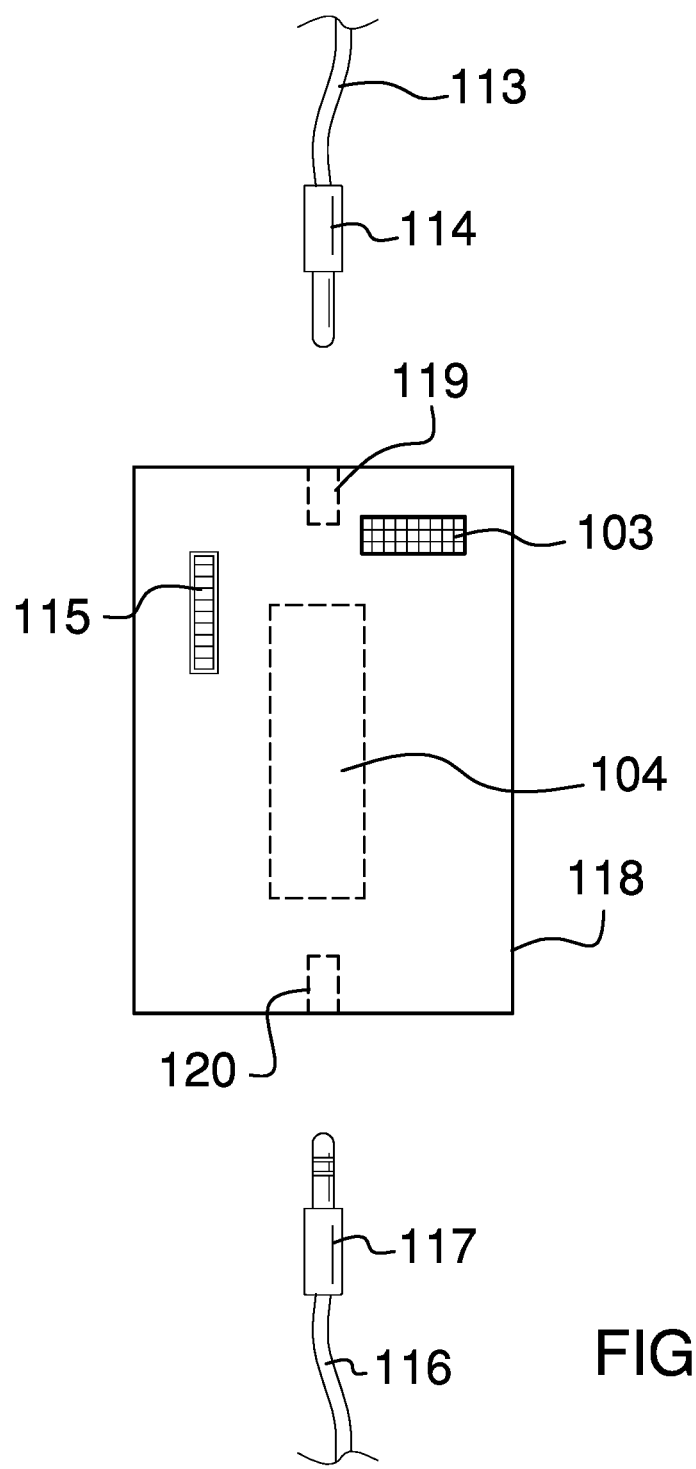
FIG. 5 is a front view of an alternative embodiment of the disclosure.

As shown in FIG. 3, the first amplifier 145, the first resistor 131 and the second resistor 132 are configured as an inverting amplifier with variable gain. The second resistor 132 controls the gain of the inverting amplifier. The variable resistance of the second resistor 132 is controlled by the volume control 115 which means that the second resistor 132 is used to determine the volume of the ambient noise audio source 153 that is provided to the first speaker 111 and the second speaker 112. The volume control 115 is discussed elsewhere in this disclosure. The second amplifier 146, the third resistor 133, and the fourth resistor 134 are configured as an inverting amplifier with unity gain. The output of the second amplifier 146 is the ambient noise audio source 153.

As shown in FIG. 3, the input circuit 121 is wired as described in this paragraph. The first lead 161 is connected to the external microphone 103. The second lead 162 and the third lead 163 are connected to each other and are connected to the negative input of the first amplifier 145. The fourth lead 164 and the fifth lead 165 are connected to each other and are connected to the output of the first amplifier 145. The sixth lead 166 and the seventh lead 167 are connected to each other and are connected to the negative input of the second amplifier 146. The eighth lead 168 is connected both the output of the second amplifier 146 and the eleventh lead 171.

The first channel 122 further comprises a fifth resistor 135, a sixth resistor 136 a seventh resistor 137, an eighth resistor 138, a ninth resistor 139, a third amplifier 147 and a fourth amplifier 148. The fifth resistor 135 is further defined with a ninth lead 169 and a tenth lead 170. The sixth resistor 136 is further defined with an eleventh lead 171 and a twelfth lead 172. The seventh resistor 137 is further defined with a thirteenth lead 173 and a fourteenth lead 174. The eighth resistor 138 is further defined with a fifteenth lead 175 and a sixteenth lead 176. The ninth resistor 139 is further defined with a seventeenth lead 177 and an eighteenth lead 178. The fifth resistor 135, the sixth resistor 136 and the seventh resistor 137 have the same resistance. The eighth resistor 138 and the ninth resistor 139 have the same resistance. The third amplifier 147 and the fourth amplifier 148 are shown as readily and commercially available operational amplifiers, however, those skilled in the art can, at their discretion, readily substitute other amplification methods.

As shown in FIG. 3, the third amplifier 147, the fifth resistor 135, the sixth resistor 136 and the seventh resistor 137 are configured as an inverting summing amplifier that is used to mix the first channel audio source 151 and the ambient noise audio source 153. The eighth resistor 138, the ninth resistor 139, and the fourth amplifier 148 are configured as an inverting amplifier with unity gain. The output of the fourth amplifier 148 is connected to the first speaker 111.

As shown in FIG. 3, the first channel 122 is wired as described in this paragraph. The ninth lead 169 is wired to the first channel audio source 151. The tenth lead 170 is connected to the twelfth lead 172, the thirteenth lead 173 and the negative input of the third amplifier 147. The eleventh lead 171 is connected to the output of the second amplifier 146. The fourteenth lead 174 is connected to both the fifteenth lead 175 and the output of the third amplifier 147. The sixteenth lead 176 is connected to the seventeenth lead 177 and the negative input of the fourth amplifier 148. The eighteenth lead 178 is connected to the first speaker 111 and to the output of the fourth amplifier 148.

The second channel 123 further comprises a tenth resistor 140, an eleventh resistor 141, a twelfth resistor 142, a thirteenth resistor 143, a fourteenth resistor 144 a fifth amplifier 149 and a sixth amplifier 150. The tenth resistor 140 is further defined with a nineteenth lead 179 and a twentieth lead 180. The eleventh resistor 141 is further defined with a twenty first lead 181 and a twenty second lead 182. The twelfth resistor 142 is further defined with a twenty third lead 183 and a twenty fourth lead 184. The thirteenth resistor 143 is further defined with a twenty fifth lead 185 and a twenty sixth lead 186. The fourteenth resistor 144 is further defined with a twenty seventh lead 187 and a twenty eighth lead 188. The tenth resistor 140, the eleventh resistor 141 and the twelfth resistor 142 have the same resistance.

The thirteenth resistor 143 and the fourteenth resistor 144 have the same resistance. The fifth amplifier 149 and the sixth amplifier 150 are shown as readily and commercially available operational amplifiers, however, those skilled in the art can, at their discretion, readily substitute other amplification methods.

As shown in FIG. 3, the fifth amplifier 149, the tenth resistor 140, the eleventh resistor 141 and the twelfth resistor 142 are configured as an inverting summing amplifier that is used to mix the second channel audio source 152 and the ambient noise audio source 153. The thirteenth resistor 143, the fourteenth resistor 144, and the sixth amplifier 150 are configured as an inverting amplifier with unity gain. The output of the sixth amplifier 150 is connected to the second speaker 112.

As shown in FIG. 3, the second channel 123 is wired as described in this paragraph. The nineteenth lead 179 is wired to the second channel audio source 152. The twentieth lead 180 is connected to the twenty second lead 182, the twenty third lead 183 and the negative input of the fifth amplifier 149. The twenty first lead 181 is connected to the output of the second amplifier 146. The twenty fourth lead 184 is connected to both the twenty fifth lead 185 and the output of the fifth amplifier 149. The twenty sixth lead 186 is connected to the twenty seventh lead 187 and the negative input of the sixth amplifier 150. The twenty eighth lead 188 is connected to the second speaker 112 and to the output of the sixth amplifier 150.

In the first potential embodiment of the disclosure, as best shown in FIGS. 1 through 5, the external microphone 103, the mixing circuit 104, and a volume control 115 are built directly into the headphones 101.

In a second potential embodiment of the disclosure, as best shown in FIG. 6, the external microphone 103, the mixing circuit 104, and the volume control 115 is put in a housing 118 that further comprises a first port 119 and a second port 120. The operation of the second potential embodiment is identical to the first potential embodiment of the disclosure with the following exceptions: the first speaker 111 and the second speaker 112 of the headphones 101 are connected to the mixing circuit 104 using the first cable 113 by plugging the first jack into the first port 119. The plurality of audio sources 154 are connected to the mixing circuit 104 through the use of a second cable 116 by plugging a second jack 117 into the second port 120.

In the first potential embodiment of the disclosure and the second potential embodiment of the disclosure, the volume of the first channel audio source 151 and the volume of the second channel audio source 152 is controlled by the external source providing these signals.

The invention 100 is used as normal headphones 101 except that the user has to use the volume control 115 to set the preferred volume for the ambient noise audio source 153.

The following definitions were used in this disclosure:

Audio Source: As used in this disclosure, an audio source is a device that generates electrical signals that can be converted in to audible sounds by a speaker.

Battery: As used in this disclosure, a battery is a container consisting of one or more cells, in which chemical energy is converted into electricity and used as a source of power.

Cable: As used in this disclosure, a cable is a collection of insulated wires covered by a protective casing that is used for transmitting electricity or telecommunication signals.

Earbud: As used in this disclosure, an earbud refers to a miniature headphone that is worn inside the ear.

Headphone: As used in this disclosure, a headphone is a device that comprises one or two earphones that are held to the ear, typically through the use of a band placed on top of the head. Headset is a synonym for headphone.

Jack: As used in this disclosure, a jack is a round pin that is plugged into a matching port in order to make and disconnect electrical connections.

Mix: As used in this disclosure, to mix is to combine two audio sources to form a single audio source.

Port: As used in this disclosure, a port is an electrical termination that is used to connect a first electrical circuit to a second external electrical circuit.

With respect to the above description, it is to be realized that the optimum dimensional relationship for the various components of the invention described above and in FIG. 1 through X, include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

What is claimed is:

1. An audio device comprising:
a headphones, an external microphone, and a mixing circuit;
wherein the audio device further comprises an integral external microphone;
wherein the external microphone picks up an ambient noise external to a user;
wherein the audio device mixes the ambient noise with a plurality of audio sources;
wherein the mixing circuit has volume control;
wherein the volume control independently sets the volume level of the ambient noise that is heard through the headphones;
wherein the headphones comprise a first speaker, a second speaker, a first cable, and a first jack;
wherein the mixing circuit receives an audio signal from the external microphone; wherein the mixing circuit amplifies the audio signal a selected volume level;
wherein the volume level is selected using a volume control;
wherein the plurality of audio sources further comprises a first audio source;
wherein the mixing circuit mixes the ambient noise audio source with the first channel audio source and announces the resulting mixed sources through the first speaker;
wherein the plurality of audio sources further comprises a second audio source;
wherein the mixing circuit mixes the ambient noise audio source with the second channel audio source and announces the resulting mixed sources through the second speaker;
wherein the mixing circuit further comprises an input circuit, a first channel, and a second channel;
wherein the input circuit generates the ambient noise audio source;

wherein the first channel mixes the ambient noise audio source with the first channel audio source and announces the resulting mixed sources through the first speaker;

wherein the second channel mixes the ambient noise audio source with the second channel audio source and announces the resulting mixed sources through the second speaker;

wherein the input circuit further comprises a first resistor, a second resistor, and a first amplifier;

wherein the second resistor is a variable resistor;

wherein the first amplifier, the first resistor and the second resistor are configured as an inverting amplifier with variable gain.

2. The audio device according to claim 1 wherein the external microphone is one of a pair of external microphones that are each provided adjacent to the first speaker and the second speaker, respectively.

3. The audio device according to claim 1 wherein
the first channel further comprises a fifth resistor, a sixth resistor, a seventh resistor, and a third amplifier;
wherein the third amplifier, the fifth resistor, the sixth resistor and the seventh resistor are configured as an inverting summing amplifier.

4. The audio device according to claim 3 wherein
the second channel further comprises a tenth resistor, an eleventh resistor, a twelfth resistor;
wherein the fifth amplifier, the tenth resistor, the eleventh resistor and the twelfth resistor are configured as an inverting summing amplifier.

5. The audio device according to claim 4 wherein
the input circuit further comprises a third resistor, a fourth resistor, and a second amplifier;
wherein the second amplifier, the third resistor, and the fourth resistor are configured as an inverting amplifier with unity gain.

6. The audio device according to claim 5 wherein
the first channel further comprises an eighth resistor, a ninth resistor, and a fourth amplifier;
wherein the eighth resistor, the ninth resistor, and the fourth amplifier are configured as an inverting amplifier with unity gain.

7. The audio device according to claim 6 wherein
the second channel further comprises a thirteenth resistor, a fourteenth resistor and a sixth amplifier;
wherein the thirteenth resistor, the fourteenth resistor, and the sixth amplifier are configured as an inverting amplifier with unity gain.

8. The audio device according to claim 7 wherein
the first resistor is further defined with a first lead and a second lead;
wherein the second resistor is further defined with a third lead and a fourth lead;
wherein the third resistor is further defined with a fifth lead and a sixth lead;
wherein the fourth resistor is further defined with a seventh lead and an eighth lead;
wherein the first lead is connected to the external microphone;
wherein the second lead and the third lead are connected to each other and are connected to the negative input of the first amplifier;
wherein the fourth lead and the fifth lead are connected to each other and are connected to the output of the first amplifier;
wherein the sixth lead and the seventh lead are connected to each other and are connected to the negative input of the second amplifier;
wherein the eighth lead is connected both the output of the second amplifier and the eleventh lead.

9. The audio device according to claim 8 wherein
the fifth resistor is further defined with a ninth lead and a tenth lead;
wherein the sixth resistor is further defined with an eleventh lead and a twelfth lead;
wherein the seventh resistor is further defined with a thirteenth lead and a fourteenth lead;
wherein the eighth resistor is further defined with a fifteenth lead and a sixteenth lead;
wherein the ninth resistor is further defined with a seventeenth lead and an eighteenth lead;
wherein the ninth lead is wired to the first channel audio source;
wherein the tenth lead is connected to the twelfth lead, the thirteenth lead and the negative input of the third amplifier;
wherein the eleventh lead is connected to the output of the second amplifier;
wherein the fourteenth lead is connected to both the fifteenth lead and the output of the third amplifier;
wherein the sixteenth lead is connected to the seventeenth lead and the negative of the fourth amplifier;
wherein the eighteenth lead is connected to the first speaker and to the output of the fourth amplifier.

10. The audio device according to claim 9 wherein
the tenth resistor is further defined with a nineteenth lead and a twentieth lead;
wherein the eleventh resistor is further defined with a twenty first lead and a twenty second lead;
wherein the twelfth resistor is further defined with a twenty third lead and a twenty fourth lead;
wherein the thirteenth resistor is further defined with a twenty fifth lead and a twenty sixth lead;
wherein the fourteenth resistor is further defined with a twenty seventh lead and a twenty eighth lead;
wherein the nineteenth lead is wired to the second channel audio source;
wherein the twentieth lead is connected to the twenty second lead, the twenty third lead and the negative input of the fifth amplifier;
wherein the twenty first lead is connected to the output of the second amplifier;
wherein the twenty fourth lead is connected to both the twenty fifth lead and the output of the fifth amplifier;
wherein the twenty sixth lead is connected to the twenty seventh lead and the negative input of the sixth amplifier;
wherein the twenty eighth lead is connected to the second speaker and to the output of the sixth amplifier.

* * * * *